(12) United States Patent
Zhao

(10) Patent No.: US 10,468,255 B2
(45) Date of Patent: Nov. 5, 2019

(54) WAFER PROCESSING METHOD

(71) Applicant: DISCO CORPORATION, Tokyo (JP)

(72) Inventor: Jinyan Zhao, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/133,137

(22) Filed: Sep. 17, 2018

(65) Prior Publication Data

US 2019/0096676 A1 Mar. 28, 2019

(30) Foreign Application Priority Data

Sep. 22, 2017 (JP) .................................. 2017-182993

(51) Int. Cl.
| | |
|---|---|
| *H01L 21/268* | (2006.01) |
| *B23K 26/70* | (2014.01) |
| *B23K 26/08* | (2014.01) |
| *H01L 21/67* | (2006.01) |
| *H01L 21/683* | (2006.01) |
| *H01L 21/78* | (2006.01) |

(52) U.S. Cl.
CPC ........ *H01L 21/268* (2013.01); *B23K 26/0853* (2013.01); *B23K 26/702* (2015.10); *H01L 21/67092* (2013.01); *H01L 21/67132* (2013.01); *H01L 21/6836* (2013.01); *H01L 21/78* (2013.01); *H01L 2221/683* (2013.01)

(58) Field of Classification Search
CPC . H01L 21/268; H01L 21/67092; H01L 21/78; H01L 21/67132; H01L 21/6836; H01L 2221/683; B23K 26/0853; B23K 26/702
See application file for complete search history.

(56) References Cited

U.S. PATENT DOCUMENTS

| | | | | |
|---|---|---|---|---|
| 8,753,923 | B2* | 6/2014 | Kobayashi | H01L 21/78 438/113 |
| 2002/0192370 | A1* | 12/2002 | Metzner | C23C 16/407 427/248.1 |
| 2004/0037206 | A1* | 2/2004 | Shinoda | C03C 3/12 369/125 |
| 2005/0180293 | A1* | 8/2005 | Ueyama | G11B 7/0903 369/112.05 |
| 2008/0007737 | A1* | 1/2008 | Sekiya | B23K 26/53 356/614 |
| 2010/0044359 | A1* | 2/2010 | Sawabe | B23K 26/03 219/121.83 |

(Continued)

FOREIGN PATENT DOCUMENTS

JP 2002192370 A 7/2002

*Primary Examiner* — John P. Dulka
(74) *Attorney, Agent, or Firm* — Greer, Burns & Crain, Ltd.

(57) ABSTRACT

A processing method for performing laser processing on a wafer includes: a reflected light detecting step of irradiating the wafer with light for state detection along a plurality of planned dividing lines, and detecting reflected light of the light from an upper surface of the wafer; a region setting step of setting a first region and a second region to the planned dividing lines based on the reflected light; a first laser processing step of performing laser processing on the first region under a first laser processing condition; and a second laser processing step of performing laser processing on the second region under a second laser processing condition.

1 Claim, 6 Drawing Sheets

(56) References Cited

U.S. PATENT DOCUMENTS

| | | | | |
|---|---|---|---|---|
| 2013/0183811 A1* | 7/2013 | Kobayashi | ............. | H01L 21/78 |
| | | | | 438/463 |
| 2016/0372349 A1* | 12/2016 | Hyakumura | ...... | H01L 21/67092 |
| 2017/0154768 A1* | 6/2017 | Zhao | ................. | H01L 21/02076 |
| 2018/0350651 A1* | 12/2018 | Zhao | ................... | H01L 21/6836 |
| 2019/0096676 A1* | 3/2019 | Zhao | ................... | B23K 26/702 |

* cited by examiner

WAFER PROCESSING METHOD

BACKGROUND OF THE INVENTION

Field of the Invention

The present invention relates to a wafer processing method.

Description of the Related Art

Device chips included in electronic apparatuses are, for example, manufactured from a disk-shaped wafer formed of a semiconductor. A plurality of intersecting planned dividing lines are set on a top surface of the wafer, and devices are formed in respective regions demarcated by the planned dividing lines. Individual device chips can be formed when the wafer is divided along the planned dividing lines. In order to divide the wafer along the planned dividing lines, a modified layer, for example, is formed within the wafer along the planned dividing lines, and cracks are extended from the modified layer in a thickness direction of the wafer. The modified layer is formed by causing multiphoton absorption by applying a laser beam having a transmission wavelength to the wafer and condensing the laser beam onto the inside of the wafer (see Japanese Patent Laid-Open No. 2002-192370).

SUMMARY OF THE INVENTION

The laser beam for forming the modified layer is applied from a top surface side or an undersurface side of the wafer along the set planned dividing lines. Supposing that a surface of the wafer which surface is irradiated with the laser beam is an irradiated surface, the state of the irradiated surface affects the properties of the laser beam condensed inside the wafer and the formed modified layer. However, the irradiated surface is not necessarily a flat and uniform surface along the planned dividing lines. Therefore, even when the irradiated surface is irradiated with the laser beam along the planned dividing lines under constant irradiation conditions, the modified layer formed within the wafer may be a modified layer reflecting minute projections and depressions and nonuniformity of the irradiated surface. For example, a nonuniform modified layer may be formed such that cracks extending from the modified layer are not formed uniformly and thus ease of division of the wafer is nonuniform. Then, there occurs a problem of occurrence of a region not divided when the wafer is divided or the like.

The present invention has been made in view of such a problem, and it is an object of the present invention to provide a wafer processing method that can form a uniform modified layer within a wafer even when a surface irradiated with a laser beam is nonuniform.

In accordance with an aspect of the present invention, there is provided a processing method for performing laser processing on a wafer by a laser processing apparatus, the laser processing apparatus including a holding table configured to hold the wafer on which a plurality of planned dividing lines are set, a laser processing unit configured to perform laser processing on the wafer held on the holding table, and a control unit in which a first laser processing condition and a second laser processing condition are registered, the processing method including: a holding step of holding the wafer on the holding table; a reflected light detecting step of, after the holding step, irradiating the wafer with light for state detection along the plurality of planned dividing lines, and detecting reflected light of the light from an upper surface of the wafer; a region setting step of setting a first region and a second region to the planned dividing lines based on the reflected light detected in the reflected light detecting step; a first laser processing step of performing laser processing on the first region set to the planned dividing lines in the region setting step under the first laser processing condition in a state in which a condensing point of a laser beam having a transmission wavelength to the wafer is positioned within the wafer; and a second laser processing step of, after the first laser processing step, performing laser processing on the second region set to the planned dividing lines in the region setting step under the second laser processing condition in a state in which the condensing point of the laser beam is positioned within the wafer.

In the wafer processing method according to the aspect of the present invention, before irradiating the wafer with the laser beam for forming a modified layer, the reflected light detecting step is performed in which light is applied along the planned dividing lines, and the reflected light of the light from the top surface of the wafer is detected. When the reflected light reflected by the top surface of the wafer as an irradiated surface of the laser beam is observed, a distribution of intensity of the reflected light reflected by the irradiated surface along the planned dividing lines is obtained. The intensity of the reflected light changes according to the state of the irradiated surface. The distribution of the intensity of the reflected light therefore reflects a distribution of the state of the irradiated surface. A laser processing condition for forming a desired modified layer differs according to the state of the irradiated surface. Thus, a more uniform modified layer can be formed along the planned dividing lines by applying the laser beam under conditions suitable for respective irradiation positions according to the distribution of the intensity of the reflected light.

However, it is not easy to change the laser processing condition frequently while irradiating the irradiated surface with the laser beam along one planned dividing line. Accordingly, the wafer processing method according to the aspect of the present invention performs the first laser processing step of performing laser processing under the first laser processing condition and the second laser processing step of performing laser processing under the second laser processing condition. The first region in which the first laser processing step is performed and the second region in which the second laser processing step is performed are set in the region setting step. The wafer processing method according to the aspect of the present invention performs laser processing in the first region along one planned dividing line under the first laser processing condition, and thereafter performs laser processing in the second region under the second laser processing condition. Thus, a uniform modified layer can be formed within the wafer by a stable laser beam without the laser processing condition being changed frequently during the processing.

Hence, the aspect of the present invention provides a wafer processing method that can form a uniform modified layer within the wafer even when a surface irradiated with a laser beam is nonuniform.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
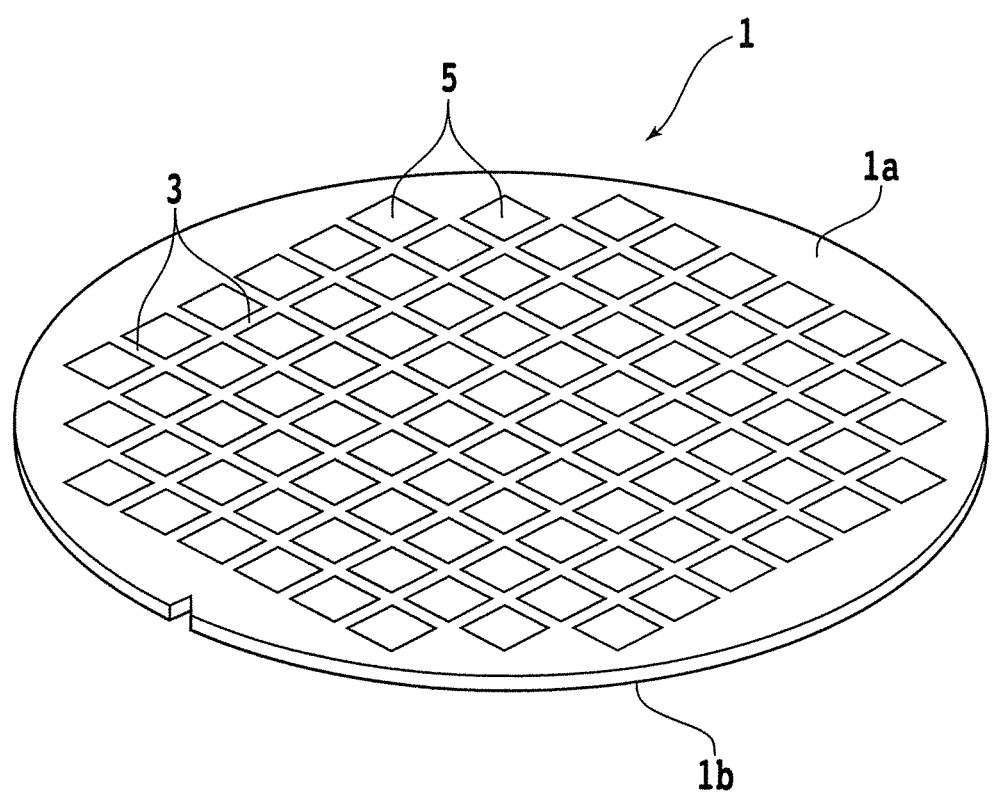
FIG. 1 is a perspective view schematically depicting a wafer.

An embodiment according to the present invention will be described with reference to the accompanying drawings. FIG. 1 is a perspective view schematically depicting a wafer 1 as a workpiece for a processing method according to the present embodiment. The wafer 1 is, for example, a disk-shaped substrate formed of a material such as silicon, SiC (silicon carbide), or another semiconductor or a material such as sapphire, glass, quartz, or the like. As depicted in FIG. 1, a plurality of planned dividing lines 3 intersecting each other are set on a top surface 1a of the wafer 1. A device 5 such as an IC (Integrated Circuit), an LED (Light Emitting Diode), or the like is formed in each of regions demarcated by the planned dividing lines 3.

Figure 2:
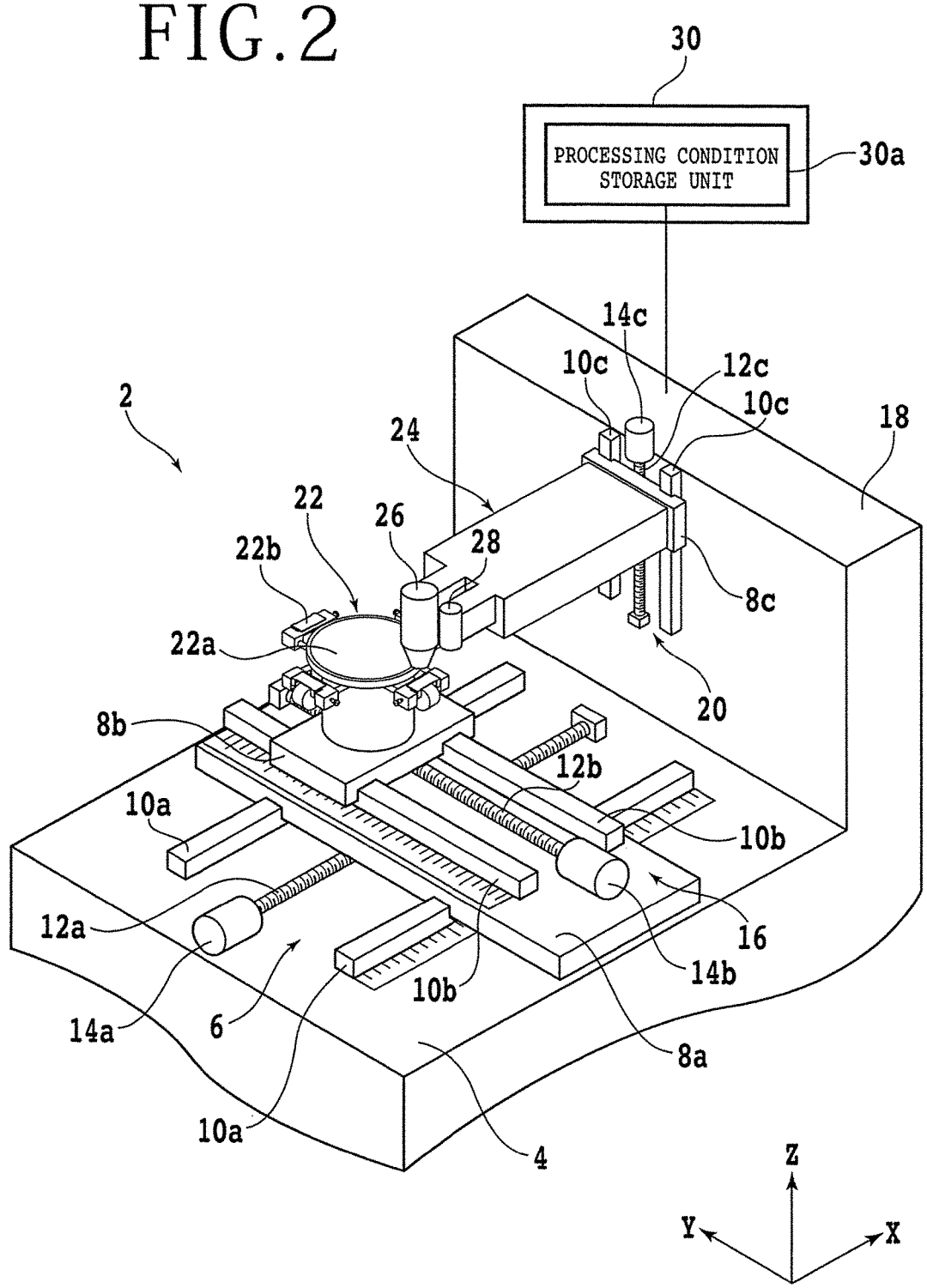
FIG. 2 is a perspective view schematically depicting a laser processing apparatus.

Description will next be made of a laser processing apparatus used by the method of processing the wafer 1 according to the present embodiment. FIG. 2 is a perspective view schematically depicting the laser processing apparatus. The laser processing apparatus 2 includes: a holding table 22 that sucks and holds the wafer 1 above a base 4; and a laser processing unit 24 that oscillates a laser beam. The holding table 22 is supported so as to be movable in an X-axis direction and a Y-axis direction by an X-axis moving mechanism 6 and a Y-axis moving mechanism 16.

The X-axis moving mechanism 6 disposed on an upper portion of the base 4 has a function of moving an X-axis moving table 8a in the X-axis direction (processing feed direction). The X-axis moving mechanism 6 includes a pair of X-axis guide rails 10a parallel with the X-axis direction, an X-axis ball screw 12a, and an X-axis pulse motor 14a. The X-axis moving table 8a is slidably attached to the X-axis guide rails 10a. A nut portion (not depicted) is provided to an undersurface side of the X-axis moving table 8a. The X-axis ball screw 12a parallel with the X-axis guide rails 10a is screwed into the nut portion. The X-axis pulse motor 14a is coupled to one end portion of the X-axis ball screw 12a. When the X-axis ball screw 12a is rotated by the X-axis pulse motor 14a, the X-axis moving table 8a moves in the X-axis direction along the X-axis guide rails 10a.

The Y-axis moving mechanism 16 disposed on an upper portion of the X-axis moving table 8a has a function of moving a Y-axis moving table 8b in the Y-axis direction (indexing feed direction). The Y-axis moving mechanism 16 includes a pair of Y-axis guide rails 10b parallel with the Y-axis direction, a Y-axis ball screw 12b, and a Y-axis pulse motor 14b. The Y-axis moving table 8b is slidably attached to the Y-axis guide rails 10b. A nut portion (not depicted) is provided to an undersurface side of the Y-axis moving table 8b. The Y-axis ball screw 12b parallel with the Y-axis guide rails 10b is screwed into the nut portion. The Y-axis pulse motor 14b is coupled to one end portion of the Y-axis ball screw 12b. When the Y-axis ball screw 12b is rotated by the Y-axis pulse motor 14b, the Y-axis moving table 8b moves in the Y-axis direction along the Y-axis guide rails 10b.

Figure 4:
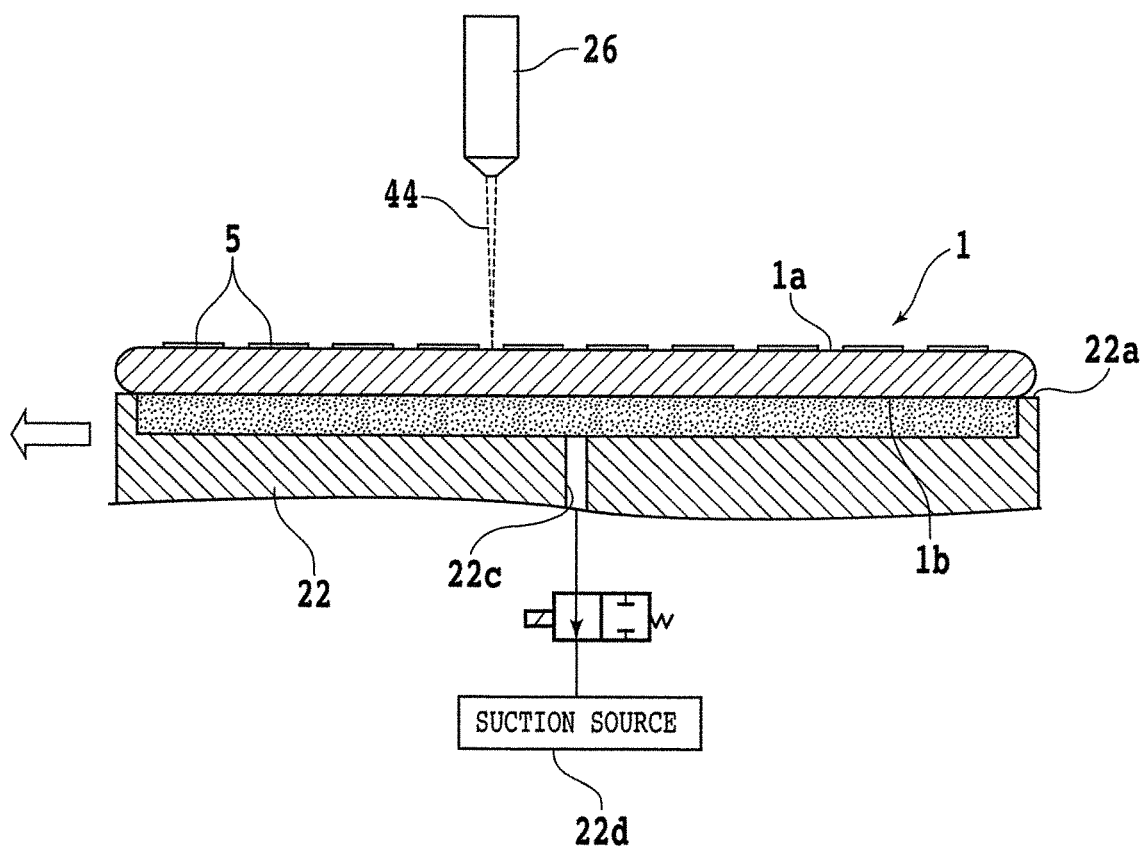
FIG. 4 is a sectional view schematically depicting a reflected light detecting step.

The holding table 22 supported by the Y-axis moving table 8b internally has a suction passage 22c (see FIG. 4) having one end thereof connected to a suction source 22d (see FIG. 4). Another end of the suction passage 22c is connected to a porous member disposed in an upper portion of the holding table 22. A top surface of the porous member constitutes a holding surface 22a. When a negative pressure is made to act on the wafer 1 placed on the holding surface 22a from the suction source 22d through the porous member, the wafer 1 is sucked and held on the holding table 22. In addition, clamps 22b gripping the wafer 1 are arranged on a peripheral side of the holding surface 22a. The holding table 22 is, for example, processing-fed by the X-axis moving mechanism 6, and is indexing-fed by the Y-axis moving mechanism 16. Further, the holding table 22 can rotate about an axis perpendicular to the holding surface 22a, and can therefore change the processing feed direction of the wafer 1 held on the holding table 22.

A column 18 is erected on a rear portion of the base 4. A Z-axis moving mechanism 20 is provided to a front surface side of the column 18. A pair of Z-axis guide rails 10c parallel with a Z-axis direction is disposed on a front surface of the column 18. A Z-axis moving table 8c is slidably attached to the Z-axis guide rails 10c. A nut portion (not depicted) is provided to an undersurface (rear surface) side of the Z-axis moving table 8c. A Z-axis ball screw 12c parallel with the Z-axis guide rails 10c is screwed into the nut portion. A Z-axis pulse motor 14c is coupled to one end portion of the Z-axis ball screw 12c. When the Z-axis ball screw 12c is rotated by the Z-axis pulse motor 14c, the Z-axis moving table 8c moves in the Z-axis direction along the Z-axis guide rails 10c.

The laser processing unit 24 is provided to a top surface (front surface) side of the Z-axis moving table 8c. The laser processing unit 24 includes: a processing head 26 that irradiates the wafer 1 held on the holding table 22 with a laser beam; and a camera unit 28 that obtains an imaged image by imaging the wafer 1 for alignment of the irradiation position of the laser beam or the like. The processing head 26 has a function of condensing the oscillated laser beam onto the inside of the wafer 1. The laser beam forms a modified layer by causing multiphoton absorption within the wafer 1.

Figure 3:
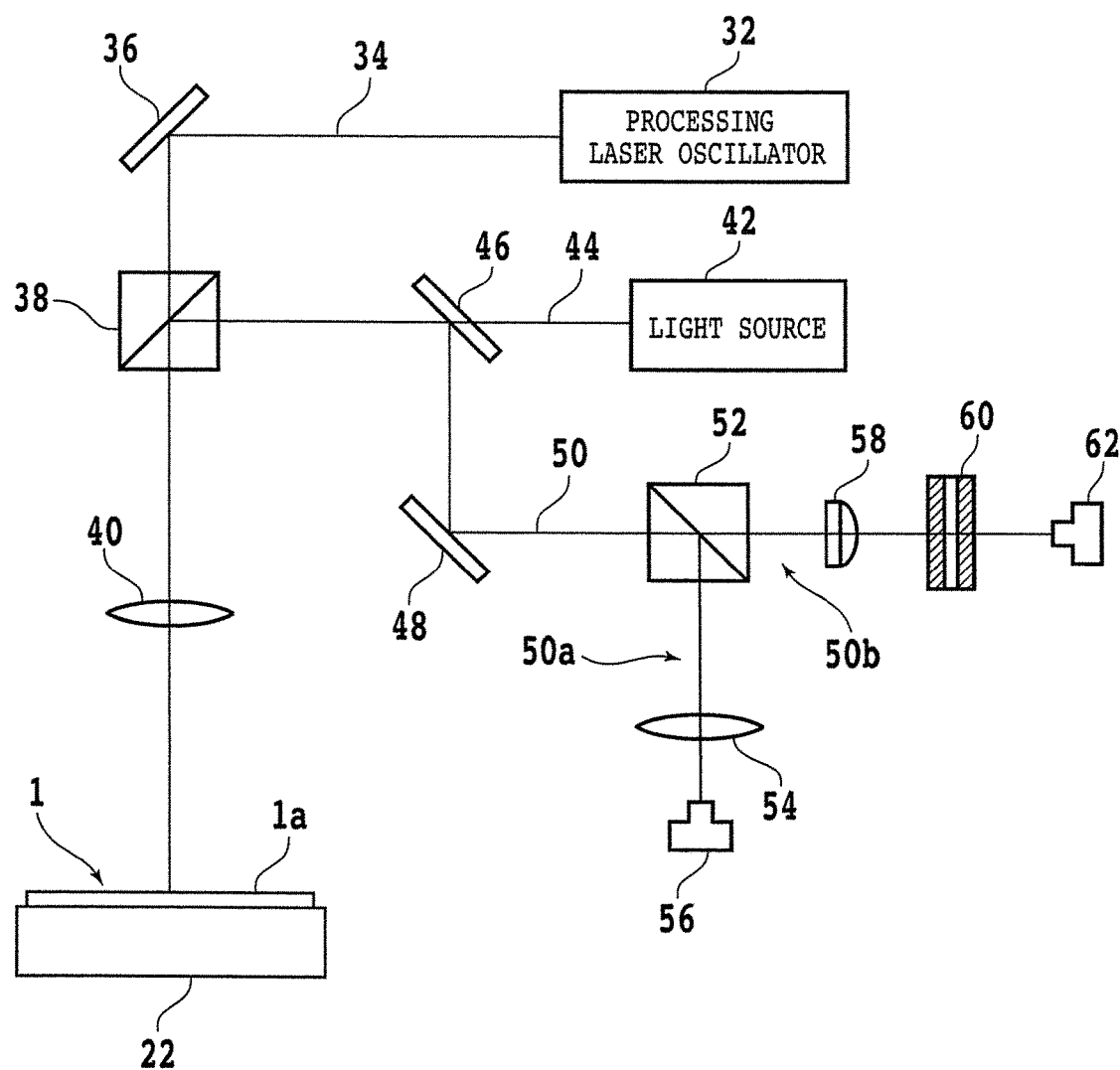
FIG. 3 is a diagram schematically depicting an optical system of the laser processing apparatus.

FIG. 3 is a diagram schematically depicting an example of an optical system of the laser processing apparatus 2. As depicted in FIG. 3, the laser processing apparatus 2 includes a processing laser oscillator 32, a light source 42, and a condensing lens 40. The condensing lens 40 is incorporated in a lower portion of the processing head 26. A laser beam 34 having a transmission wavelength to the wafer 1 with $Nd:YVO_4$ or Nd:YAG as a medium, for example, is oscillated from the processing laser oscillator 32. The laser beam 34 oscillated by the processing laser oscillator 32 is reflected by a mirror 36, transmitted through a dichroic mirror 38, and condensed onto the inside of the wafer 1 held on the holding table 22 by the condensing lens 40. When the laser beam 34 is condensed, multiphoton absorption occurs within the wafer 1, and consequently a modified layer is formed.

In addition, light 44 is emitted from the light source 42 to observe the state of the top surface 1a of the wafer 1. The light 44 is a laser beam with a He—Ne mixed gas of a wavelength 810 to 830 nm as a medium, for example. The light 44 emitted from the light source 42 is transmitted through a half-silvered mirror 46, reflected by the dichroic mirror 38, condensed onto the top surface 1a (upper surface) of the wafer 1 held on the holding table 22 by the condensing lens 40, and reflected by the top surface 1a. The reflected light 50 reflected by the top surface 1a passes through the condensing lens 40 again, is reflected by the dichroic mirror 38, and reaches the half-silvered mirror 46. The reflected light 50 is reflected by the half-silvered mirror 46, reflected by a mirror 48, and divided into light 50a and light 50b by a beam splitter 52.

The light 50a divided so as to be reflected by the beam splitter 52 is condensed onto a light receiving element 56 by a condensing lens 54. The light receiving element 56 receives the light 50a reaching the light receiving element 56, and measures the intensity of the light 50a or the like. The intensity of the light 50a reflects the state of the top surface 1a of the wafer 1. Thus, the distribution of a state such as a reflecting state or the like of the top surface 1a of the wafer 1 is obtained by obtaining the intensity of the light 50a at each measurement position of the top surface 1a. In addition, the light 50b divided so as to be transmitted by the beam splitter 52 reaches a cylindrical lens 58, is condensed into one dimension, is regulated to a predetermined width by a one-dimensional mask 60, and reaches a light receiving element 62. The light receiving element 62 receives the light 50b reaching the light receiving element 62, and measures the intensity of the light 50b or the like. The intensity of the light 50b regulated to the predetermined width changes according to the height position of the top surface 1a of the wafer 1. The height position of the top surface 1a of the wafer 1 can therefore be detected from the intensity of the light 50a.

The laser processing unit 24 can be moved in the Z-axis direction by the Z-axis moving mechanism 20. Moving the laser processing unit 24 in the Z-axis direction can change the height of a condensing point of the processing head 26 (the condensing lens 40). Therefore, by controlling the Z-axis moving mechanism 20, it is possible to condense the laser beam 34 at a predetermined height position within the wafer 1, and condense the light 44 onto the top surface 1a (upper surface) of the wafer 1. Further, modified layers can be formed at a plurality of respective height positions within the wafer 1 by condensing the laser beam at a plurality of height positions of the wafer 1.

The laser processing apparatus 2 further includes a control unit 30 that controls each constituent element of the laser processing apparatus 2. The control unit 30 controls laser processing of the wafer 1 by the laser processing unit 24. The control unit 30 includes a processing condition storage unit 30a in which a plurality of laser processing conditions are registered. Various laser processing conditions for dealing with the state of the wafer 1 and obtaining a desired processing result are registered in the processing condition storage unit 30a. The laser processing conditions may, for example, be registered into the processing condition storage unit 30a in advance by a manufacturer of the laser processing apparatus 2. In addition, a user of the laser processing apparatus 2 may create laser processing conditions while checking actual processing conditions, and register the laser processing conditions in the processing condition storage unit 30a. In addition, the control unit 30 is connected to the light receiving element 56, and has a function of obtaining a distribution of the state of the top surface 1a of the wafer 1 from the intensity of the light 50a observed by the light receiving element 56, and setting a plurality of regions along the planned dividing lines so as to correspond to the distribution. A uniform modified layer along the planned dividing lines can be formed within the wafer 1 by performing laser processing on each of the regions set by the control unit 30 under the laser processing conditions suitable for each of the regions.

The processing method according to the present embodiment will next be described. In the processing method, first, a holding step is performed in which the wafer 1 is held on the holding table 22. In the holding step, the wafer 1 is placed on the holding table 22 in a state in which a surface of the wafer 1 which surface is to be irradiated with the laser beam 34 when a modified layer is formed within the wafer 1 is directed upward, and a surface of the wafer 1 which surface is not to be irradiated with the laser beam is directed downward. In a case where the top surface 1a side is to be irradiated with the laser beam 34, the wafer 1 is placed on the holding table 22 such that the top surface 1a side is directed upward, and an undersurface 1b is in contact with the holding surface 22a of the holding table 22. Then, the wafer 1 is sucked and held onto the holding table 22 by actuating the suction source 22d and thus making a negative pressure act on the wafer 1 from the holding table 22.

After the holding step is performed, a reflected light detecting step is performed in which the wafer 1 is irradiated with the light 44 for state detection along the plurality of planned dividing lines, and the reflected light 50 of the light 44 from the top surface 1a (upper surface) of the wafer 1 is detected. The reflected light detecting step will be described with reference to FIG. 4. FIG. 4 is a sectional view schematically depicting the reflected light detecting step. First, in order to apply the light 44 along one of the planned dividing lines on the wafer 1, the holding table 22 is moved so that the processing head 26 is disposed above an extension of the planned dividing line on the outside of the wafer 1. Then, the condensing point of the condensing lens 40 is located at the height position of the top surface 1a of the wafer 1 by positioning the processing head 26 at a predetermined height. Next, the light 44 is applied from the processing head 26 to the top surface 1a of the wafer 1 while the holding table 22 is moved along a processing feed direction. When the light 44 is applied, the reflected light 50 having intensity corresponding to the state of the top surface 1a is reflected. The reflected light 50 enters the processing head 26, and the light 50a, which is a part of the reflected light 50, is detected by the light receiving element 56. The light receiving element 56 transmits the intensity of the received light 50a to the control unit 30.

Figure 5:
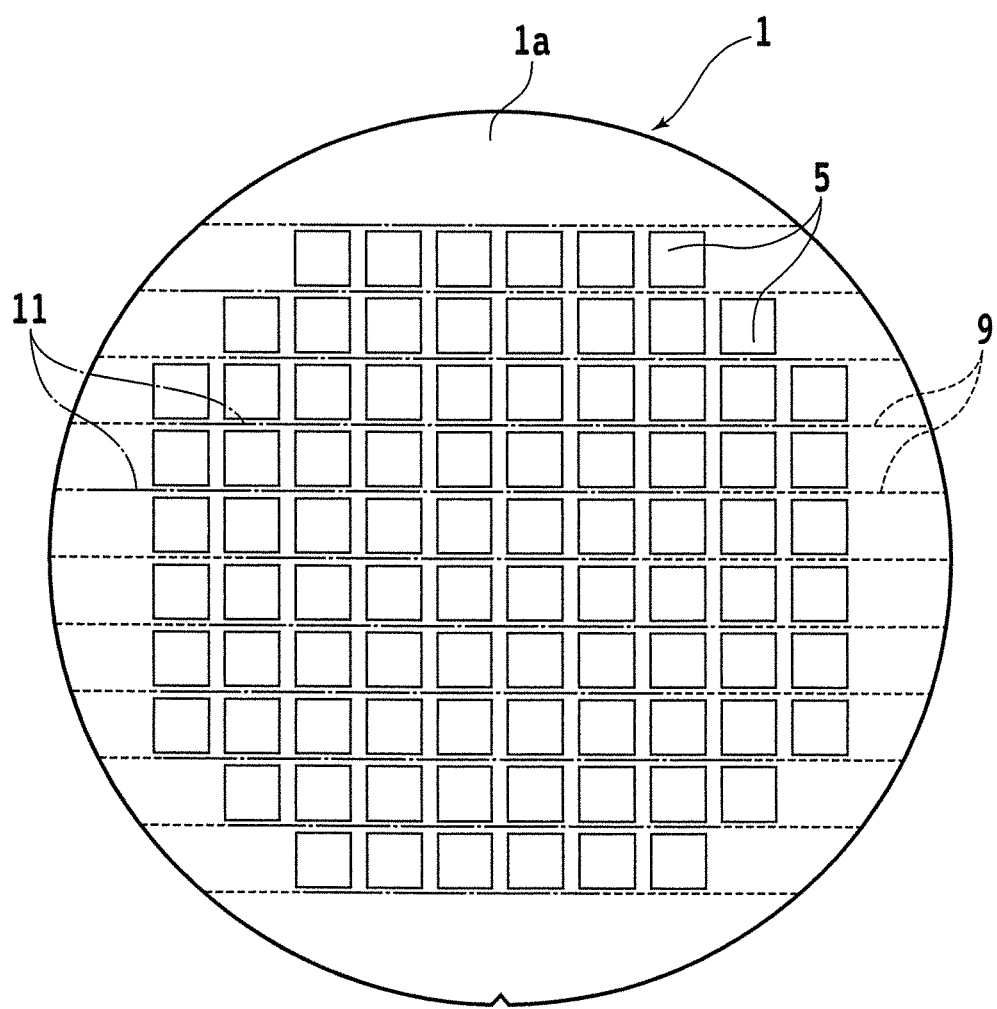
FIG. 5 is a plan view schematically depicting an example of regions set in a region setting step.

Next, a region setting step is performed in which a first region and a second region are set in the planned dividing line based on the reflected light detected in the reflected light detecting step. The control unit 30 obtains information on the intensity of the light 50a which intensity is sent from the light receiving element 56, and creates intensity distribution information of the light 50a along the planned dividing line. The intensity of the light 50a is affected by the state of the top surface 1a. The distribution therefore reflects the distribution of the state of the top surface 1a. The control unit 30 sets a plurality of regions on the top surface 1a along the planned dividing line based on the intensity distribution information. FIG. 5 is a plan view schematically depicting an example of the regions set in the region setting step. As an example, either a region in which the intensity of the light 50a is lower than a predetermined threshold value or a region in which the intensity of the light 50a is higher than the predetermined threshold value is set as a first region 9, and the other is set as a second region 11. In FIG. 5, the first region 9 is represented by a broken line, and the second region 11 is represented by alternate long and short dashed lines. Incidentally, the control unit 30 may set three or more kinds of regions on the top surface 1a along the planned dividing line.

Figure 6:
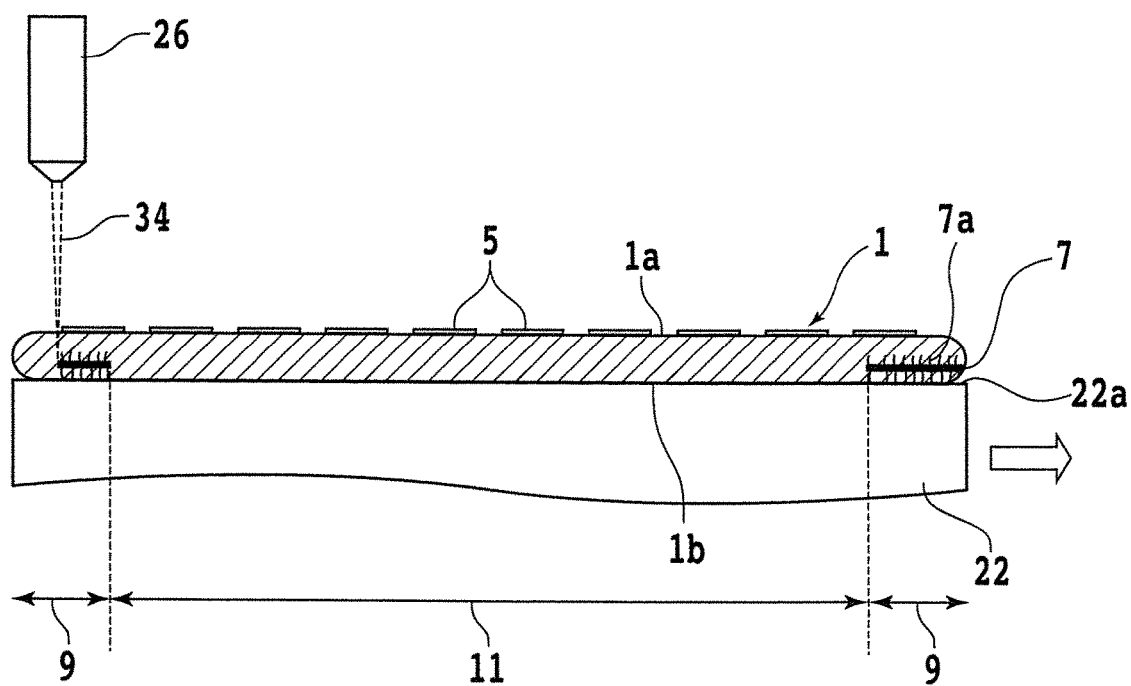
FIG. 6 is a sectional view schematically depicting a first laser processing step.

Next, a first laser processing step is performed in which laser processing is performed on the first region 9 in the planned dividing line under a first laser processing condition. In the first laser processing step, the control unit 30 reads the first laser processing condition from the processing condition storage unit 30a. FIG. 6 is a sectional view schematically depicting the first laser processing step. According to the first laser processing condition, the condensing point of the processing head 26 is positioned within the wafer 1, and the wafer 1 is irradiated with the laser beam 34 while the holding table 22 is processing-fed. At this time, the laser beam 34 is applied only to the first region 9 of the wafer 1, and is not applied to the second region 11. Then, a modified layer 7 along the first region 9 is formed within the wafer 1. Cracks 7a extending from the modified layer 7 in a thickness direction of the wafer 1 may be formed at the same time.

After the first laser processing step is performed, a second laser processing step is performed in which laser processing is performed on the second region 11 in the planned dividing line under a second laser processing condition. In the second laser processing step, the control unit 30 reads the second laser processing condition from the processing condition storage unit 30a. According to the second laser processing condition, the condensing point of the processing head 26 is positioned within the wafer 1, and the wafer 1 is irradiated with the laser beam 34 while the holding table 22 is processing-fed. At this time, the laser beam 34 is applied only to the second region 11 of the wafer 1, and is not applied to the first region. Then, a modified layer along the second region 11 of the planned dividing line is formed within the wafer 1. Cracks extending from the modified layer may also be formed.

Incidentally, in a case where three or more kinds of regions are set in the planned dividing line in the region setting step, a third or subsequent laser processing steps are performed for the remaining region(s). After the above steps are performed, a uniform modified layer is formed along the planned dividing line on the wafer 1. An example of the first laser processing condition and the second laser processing condition will be described in the following.

Under the first laser processing condition, the wafer 1 is irradiated with the laser beam 34 with a power of 3 W and a processing feed speed of 300 mm/second, for example. The laser beam 34 is applied while the condensing point of the laser beam 34 is located at a depth of 100 μm from the top surface 1a (upper surface), and the laser beam 34 is thereafter applied again while the condensing point of the laser beam 34 is located at a depth of 70 μm. Then, a modified layer constituted of two layers is formed in the first region 9. Under the second laser processing condition, the wafer 1 is irradiated with the laser beam 34 with a power of 2 W and a processing feed speed of 600 mm/second, for example. The laser beam 34 is applied while the condensing point of the laser beam 34 is located at a depth of 110 μm from the top surface 1a (upper surface), and the laser beam 34 is thereafter applied again while the condensing point of the laser beam 34 is located at a depth of 80 μm. Further, the laser beam 34 is applied while the condensing point of the laser beam 34 is located at a depth of 50 μm. Then, a modified layer constituted of three layers is formed in the second region 11.

The modified layers including different numbers of layers are formed in the first region 9 and the second region 11, respectively. However, because laser processing is performed under the conditions suitable for the respective regions set according to the distribution of the state of the top surface 1a of the wafer 1, ease of division of the wafer 1 is uniform in the whole of the regions of the planned dividing line. A uniform modified layer in the present embodiment refers to a modified layer such that ease of division of the wafer 1 when the wafer 1 is to be divided is similar over the whole of the regions. Hence, nonuniformity of other properties of the modified layer is also included.

In the method of processing the wafer 1 according to the present embodiment, laser processing is performed on the first region 9 of one planned dividing line under the first laser processing condition, and then laser processing is performed on the second region 11 under the second laser processing condition. On the other hand, a problem may occur in a case where, for example, laser processing is performed on the first region 9 along one planned dividing line under the first laser processing condition and the laser processing is continued by switching to the second laser processing condition when a processing point moves to the second region 11. That is, when the power of the laser beam is varied rapidly, the laser beam may be unstable, and thus a desired modified layer may not be formed. In addition, when modified layers including different numbers of layers are formed in the respective regions, desired modified layers cannot be formed by merely changing the laser processing conditions. In the method of processing the wafer 1 according to the present embodiment, the second laser processing step is performed after performing the first laser processing step. Thus, even when there are large differences between the first processing condition and the second processing condition, the respective pieces of laser processing can be performed stably.

After the first laser processing step is performed along one planned dividing line, the first laser processing step is similarly performed on another planned dividing line extending in the same direction as the one planned dividing line. After the first laser processing step is performed along all of planned dividing lines extending in the direction, the second laser processing step is performed along all of the planned dividing lines extending in the direction. Thereafter, the holding table 22 is rotated, and the reflected light detecting step and the region setting step are performed for planned dividing lines arranged along the other direction. The first laser processing step and the second laser processing step are thereafter similarly performed along all of the planned dividing lines arranged along the other direction. Then, a uniform modified layer can be formed along all of the planned dividing lines on the wafer 1.

Incidentally, when a uniform modified layer is formed along all of the planned dividing lines on the wafer 1, each step may be performed in other order. For example, the reflected light detecting step and the region setting step are performed on planned dividing lines along a first direction, the holding table 22 is rotated, and the reflected light detecting step and the region setting step are performed on planned dividing lines along a second direction. Thereafter, the first laser processing step and the second laser processing step may be performed along the second direction, the holding table 22 may be rotated, and the first laser processing step and the second laser processing step may be performed along the first direction. In addition, for example, the reflected light detecting step and the region setting step are performed on the planned dividing lines along the first direction, the holding table 22 is rotated, and the reflected light detecting step and the region setting step are performed on the planned dividing lines along the second direction. Thereafter, the holding table 22 may be rotated, the first laser processing step and the second laser processing step may be performed along the first direction, the holding table 22 may be rotated, and the first laser processing step and the second laser processing step may be performed along the second direction.

A uniform modified layer can be formed within the wafer 1 by the wafer processing method described above even when the surface irradiated with the laser beam is nonuniform.

Incidentally, the laser processing conditions stored in the processing condition storage unit 30*a* and conditions such as the threshold value for the intensity of the reflected light 50 (the light 50*a*) at the time of setting regions in the region setting step, for example, be determined so as to reflect a result of experimental processing on a same kind of wafer 1 which experimental processing is performed in advance. For example, each region of the top surface 1*a* (upper surface) of the same kind of wafer 1 is irradiated with the light 44 for observing the state of the top surface 1*a* of the wafer 1 as in the above-described reflected light detecting step, and a distribution of the intensity of the reflected light 50 (the light 50*a*) is obtained. In addition, in each region of the wafer 1, a modified layer is formed within the wafer 1 as in each of the above-described laser processing steps under various laser processing conditions. Then, relations between the state of the top surface 1*a* of the wafer 1, the laser processing conditions, and ease of division of the wafer 1 are obtained. When the relations are used, each laser processing condition and the conditions such as the threshold value for the intensity of the light 50*a* at the time of setting regions in the region setting step and the like can be determined so that a uniform modified layer can be formed in the wafer 1. Then, a uniform modified layer can be similarly formed by subjecting a wafer 1 of the same kind to the method of processing the wafer 1 according to the present embodiment.

It is to be noted that the present invention is not limited to the description of the foregoing embodiment, but can be changed and carried out in various manners. For example, while in the foregoing embodiment, description has been made of a case where the top surface 1*a* of the wafer 1 on which surface the devices 5 are formed is set as an upper surface, and the upper surface is irradiated with the laser beam, the present invention is not limited to this. The undersurface 1*b* side of the wafer 1 on which side the devices 5 are not formed may be set as an upper surface, and a modified layer may be formed within the wafer 1 by irradiating the upper surface with the laser beam. In this case, the wafer 1 is held on the holding table 22 in a state in which the top surface 1*a* side is oriented downward. However, a surface protective tape may be affixed to the top surface 1*a* in advance in order to protect the devices 5, and the wafer 1 may be held on the holding table 22 via the surface protective tape.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A processing method for performing laser processing on a wafer by a laser processing apparatus, the laser processing apparatus including a holding table configured to hold the wafer on which a plurality of planned dividing lines are set, a laser processing unit configured to perform laser processing on the wafer held on the holding table, and a control unit in which a first laser processing condition and a second laser processing condition are registered, the processing method comprising:

a holding step of holding the wafer on the holding table;

a reflected light detecting step of, after the holding step, irradiating the wafer with light for state detection along the plurality of planned dividing lines, and detecting reflected light of the light from an upper surface of the wafer;

a region setting step of setting a first region and a second region to the planned dividing lines based on the reflected light detected in the reflected light detecting step;

a first laser processing step of performing laser processing on the first region set to the planned dividing lines in the region setting step under the first laser processing condition in a state in which a condensing point of a laser beam having a transmission wavelength to the wafer is positioned within the wafer; and a second laser processing step of, after the first laser processing step, performing laser processing on the second region set to the planned dividing lines in the region setting step under the second laser processing condition in a state in which the condensing point of the laser beam is positioned within the wafer.

* * * * *